United States Patent [19]

Dobrovolny et al.

[11] Patent Number: 4,621,245

[45] Date of Patent: Nov. 4, 1986

[54] INTERMEDIATE FREQUENCY FILTER FOR A DBS RECEIVER

[75] Inventors: Pierre Dobrovolny, North Riverside; Dominic J. Nicoletto, Melrose Park, both of Ill.

[73] Assignee: Zenith Electronics Corporation, Glenview, Ill.

[21] Appl. No.: 608,329

[22] Filed: May 8, 1984

[51] Int. Cl.⁴ ........................ H01P 1/20; H03H 7/09; H03H 7/12

[52] U.S. Cl. ........................ 333/202; 333/174; 333/180; 333/223

[58] Field of Search ........................ 333/167-168, 333/174-185, 202-212, 246; 334/85

[56] References Cited

U.S. PATENT DOCUMENTS

| | | | |
|---|---|---|---|
| 2,751,558 | 6/1956 | Grieg et al. | 333/238 X |
| 3,763,447 | 10/1973 | Takahashi et al. | 333/202 |
| 4,210,884 | 7/1980 | Tabuchi et al. | 333/212 X |
| 4,374,370 | 2/1983 | Popovski et al. | 333/202 |
| 4,423,396 | 12/1983 | Makimoto et al. | 333/246 X |

OTHER PUBLICATIONS

Hägele—"Mikrowellenfilter mit Umwegkopplungen zur Erzeugung von Dampfungspolen", Frequenz 24 (1970), 11; pp. 340-341.

Geffe—"Simplified Modern Filter Design", John F. Rider Publisher, Inc., New York, 1963; pp. 42-48.

*Primary Examiner*—Marvin L. Nussbaum

[57] ABSTRACT

A quadruple tuned 400 MHz IF filter comprises a rectangular substrate having a foil pattern of four inductors formed on one side thereof with four leadless capacitors and three lead type coupling capacitors interconnected between the inductors and the foil to form a filter. The inductors are arranged in a generally U-shaped configuration with the input inductor and output inductor being located at the legs of the U adjacent to each other for providing electromagnetic coupling between the input and output of the filter to sharpen the response of the filter along the skirts of the response curve. A triple tuned filter includes three helical resonators that are coupled by mutual stray capacitances. Output to input coupling is achieved with two wires connected to the input and output helical resonators and positioned adjacent to the middle helical resonator.

11 Claims, 9 Drawing Figures

FIGURE 7
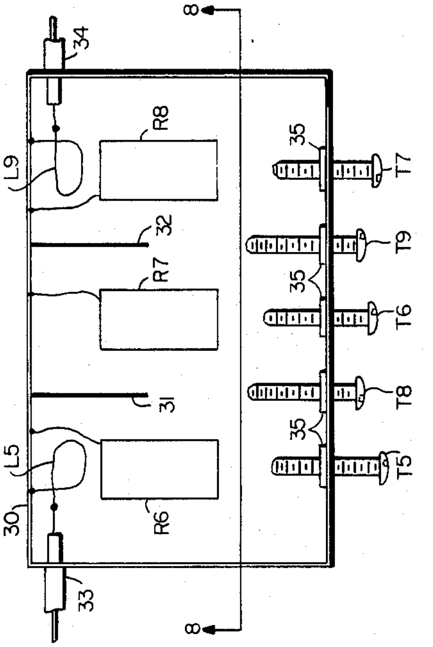
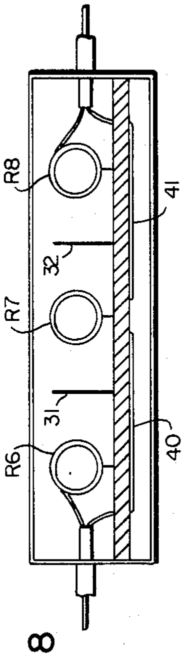
FIGURE 8
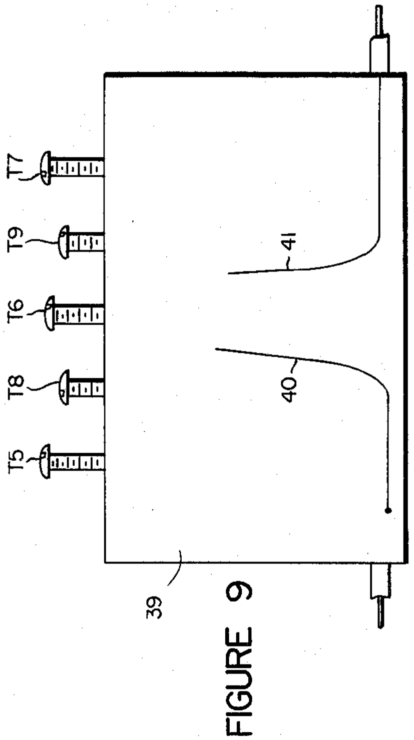
FIGURE 9
FIGURE 5
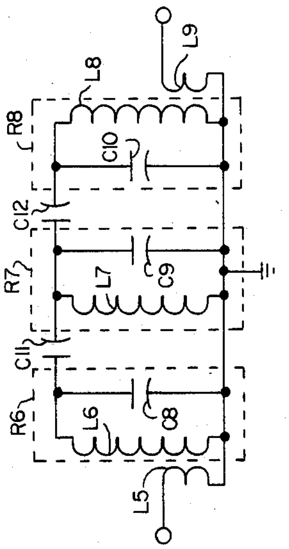
FIGURE 6
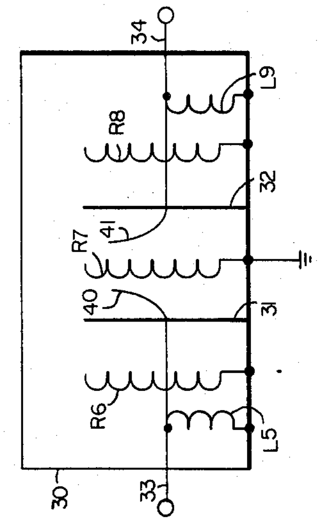

INTERMEDIATE FREQUENCY FILTER FOR A DBS RECEIVER

BACKGROUND OF THE INVENTION AND PRIOR ART

This invention relates generally to high frequency filter circuits and particularly to intermediate frequency (IF) filter circuits for use in connection with direct broadcast satellite (DBS) television receivers.

DBS television generally involves FM modulating a plurality of baseband television video and sound signals onto an "uplink" microwave carrier which is directed at one or more satellites and transmitted back at about 12 gigahertz to permit reception at remote points with suitable apparatus. Individual microwave receivers are coupled to suitable dish antennas and are generally located close to the antenna in environmentally protected enclosures. The outside receiver unit comprises an RF amplifier, a high frequency oscillator and a mixer for converting the 12 gigahertz signal into a signal of more manageable frequency, such as for example a 1 gigahertz IF frequency. The IF frequency containing a number of television channels, is supplied to a converter located in the house, where it is amplified, filtered and the desired baseband television signal recovered by detection of the FM modulation. The recovered baseband television signal is then processed and may be fed in either composite or RGB format to a television monitor or it may be remodulated onto a suitable carrier frequency for presentation to the radio frequency tuner input of a conventional television receiver. The remodulated signal is generally on carriers corresponding to television VHF channels 3 or 4, as with most video cassette recorders and video games.

Since all of the described equipment, except for the television receiver, is additional there is an understandable desire to keep its cost low to permit the direct broadcast service without placing an undue economic burden on subscribers. It is also highly desirable to minimize the size of the added equipment, which in most instances is separate from the television receiver. Since obvious goals in all such apparatus are uniformity in performance and ease of manufacture, it is desirable to use simple circuits that are readily aligned and that are stable in operation.

OBJECTS OF THE INVENTION

A principal object of this invention is to provide a novel filter circuit.

Another object of this invention is to provide a low cost 400 MHz filter circuit with good selectivity.

Another object of this invention is to provide a small, low cost stable 400 MHz IF filter.

SUMMARY OF THE INVENTION

In accordance with the invention, a low cost, compact, high frequency filter comprises a plurality of resonators, capacitance means coupling the resonators to form a multiple tuned filter having an input resonator and an output resonator, input and output connections to so said input and output resonators and means for mutually coupling the input resonator with the output resonator for sharpening the frequency pass band of the filter.

BRIEF DESCRIPTION OF THE DRAWINGS

These and other objects of the invention will be apparent from reading the following description in conjunction with the drawings in which:

FIG. 5 is a schematic diagram of a triple tuned filter in another form of the invention;

FIG. 6 is a simplified showing of the arrangement of the filter of FIG. 5;

FIG. 7 is a view of an actual filter corresponding to FIG. 6;

FIG. 8 is a sectional view of the filter of FIG. 7 taken along line 8—8; and

FIG. 9 is an obverse view of the filter of FIG. 7.

DESCRIPTION OF THE PREFERRED EMBODIMENT

Figure 1:
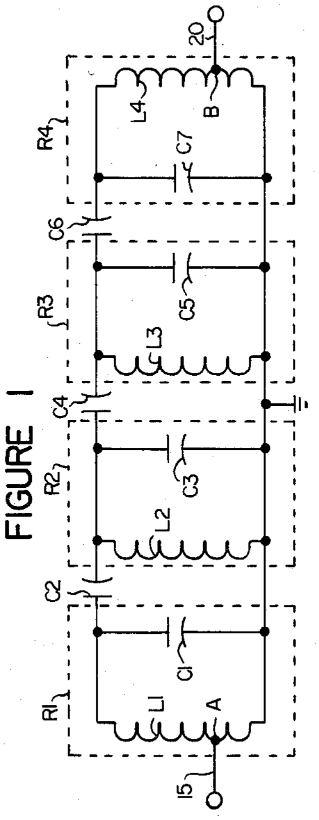
FIGURE 1 PRIOR ART
FIG. 1 represents an electrical diagram of a quadruple tuned prior art filter.

Referring to FIG. 1, a schematic diagram of a quadruple tuned prior art filter is illustrated, which will be recognized as a commonly used configuration for a band pass filter. It consists of an inductor L1 connected in parallel with a capacitor C1 to form a first resonator R1, indicated by the dashed line box enclosing L1 and C1. A second inductor L2 and a parallelly coupled capacitor C3 forms a second resonator R2 that is connected to R1 by means of a coupling capacitor C2. Similarly, third and fourth resonators R3 and R4 consisting of L3–C5 and L4–C7 are sequentially coupled together by capacitors C4 and C6, respectively. The inductor L1 of input resonator R1 is tapped by a lead 15 connected to an input terminal. Similarly, inductor L4 of output resonator R4 is tapped by a lead 20 connected to an output terminal. These taps enable, for example, a 75 ohm input and output impedance match. It will be appreciated by those skilled in the art that by proper selection of values, a filter may be constructed which will exhibit a normal pass band characteristic without evidence of frequency trapping along the skirts of the response curve. Thus, by using conventional construction techniques with single turn coils or inductors of several nanohenries each, capacitors C1, C3, C5 and C7 each equal to about 10 pf, capacitors C2 and C6 equal to about 1.0 pf and capacitor C4 equal to about 0.5 pf, a filter was produced having a 1 dB bandwidth of 25 MHz with a 400 MHz center frequency. The bandwidth at 30 dB down, however, was over 72 MHz wide with the requirement for use in a DBS receiver being a bandwidth of 66 MHz or less.

The filter constructed in accordance with one form of the invention is designed for compact fabrication as part of a larger printed circuit board used in a 400 MHz multi-stage amplifier, for raising the IF signal level prior to detection and recovery of the FM modulated baseband television signals. Only the filter circuit is of interest in this invention. The filter was formed on a foil covered phenolic substrate in a generally U-shaped configuration to enhance coupling between the output and input resonators of the filter to improve the skirt selectivity, i.e., sharpen the frequency response, and to obtain the very compact construction. This filter measures approximately 2 3/16 inches by 1⅝ inches and requires a minimum amount of shielding, as will be described.

Figure 2:
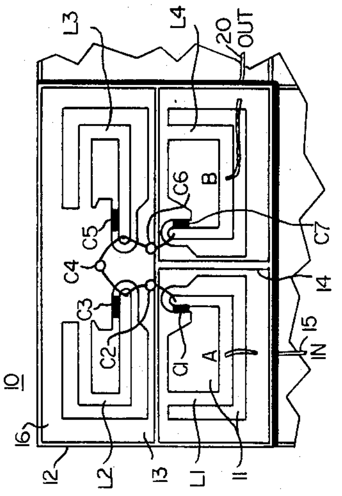
FIG. 2 is a foil-side view of a quadruple tuned filter in one form of the invention.
Figure 3:
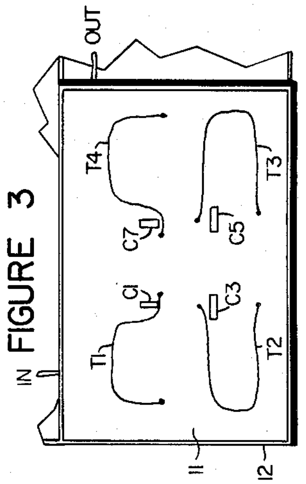
FIG. 3 is an obverse view of the filter of FIG. 2.

Referring to FIG. 2 and to FIG. 3, which is the underside of FIG. 2, a filter 10 includes a substrate 11 with one side having a foil pattern 16 formed thereon. As mentioned above substrate 11 is significantly larger than the portion illustrated since the filter is preferably combined with suitable input and ouotput amplifiers for amplifying the 400 MHz IF signal. A generally vertical rectangular shield 12 is mechanically affixed to the substrate and the edges of foil pattern 16 soldered or otherwise electrically connected thereto. A shield member 13 extends across the long dimension of shield 12 and a shield member 14 extends between the input and output sections of the filter. The arrangement provides a filter with three compartments containing four resonators. Suitable apertures are formed in the shields where required to allow passage of connecting wires between adjacent compartments. This is required, for example, for the input and output connections and for certain capacitor leads. The foil pattern is preferably etched to produce a plurality of loops indicated as L1, L2, L3 and L4. The loops function as inductors, as is well known, and have an inductance of several nanohenries each. A plurality of leadless trapezoidal shaped capacitors C1, C3, C5 and C7 are inserted in suitable shaped apertures in substrate 11 and soldered between the ends of the inductors and the common or ground portions of foil pattern 16. Three small lead type capacitors C2, C4 and C6 are connected to the appropriate points in the circuit, as illustrated in FIG. 1 and in FIG. 2. The leadless capacitors and the lead type capacitors and the manner of their use in the filter and the method of forming the printed circuit inductors from a foil covered substrate are all well known in the art and form no part of the present invention. Taps on inductors L1 and L4, indicated by points A and B respectively, are connected to input and output leads 15 and 20, respectively.

The bottom of the substrate is not foil covered and the lower portions of leadless capacitors C1, C3, C5 and C7 are shown protruding therethrough. A plurality of wire loops T1, T2, T3 and T4 are aligned with inductors L1–L4 and may be physically manipulated to affect the tuning of the various sections of the filter. It will be noted that no shielding is provided on the underside of the substrate. Consequently, there is a substantial amount of mutual coupling between the input and output sections of the filter because of the U-shaped configuration of the three compartments which places the filter output and the filter input adjacent to each other. It is this mutual coupling between the output and input that produces the notches in the response curve of the filter and essentially sharpens the frequency response along the skirts to achieve the desired pass band without the need for additional elements.

Figure 4:
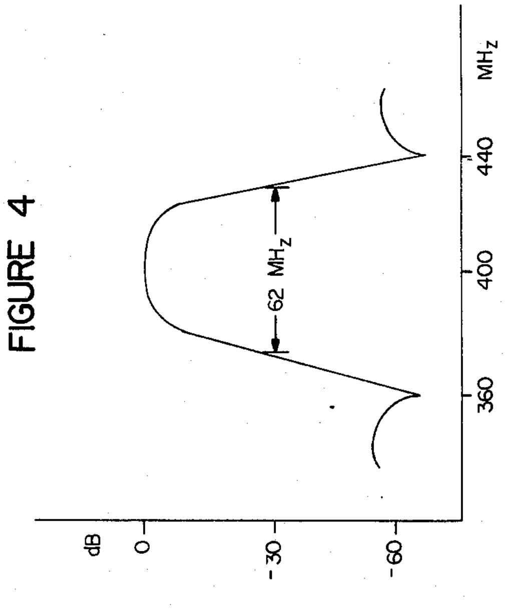
FIG. 4 is a plot of the frequency response of the filter of FIGS. 2 and 3.

As reference to FIG. 4 will illustrate, the response curve includes a pair of sharply defined notches at approximately 360 MHz and 440 MHz. These notches result from the input-output coupling and their presence narrows the frequency curve along the skirts and produces approximately a 62 MHz bandwidth at the 30 dB points. It will be further appreciated by those skilled in the art that the input and output coupling may be achieved by a number of different techniques. For example, the compartments of the filter may be completely isolated from each other and a wire coupling loop provided from the input back to the output. In the U-shaped printed circuit board implementation, the physical positioning of the input and output resonators adjacent to each other provides a strong coupling. It may be that some shielding may be desirable to reduce the amount of this coupling. In that event, shield 14 need not be soldered along its bottom edge to foil pattern 16, but may be vertically movable to provide a larger coupling window on the foil side of the substrate. Other forms of coupling will be readily apparent.

FIG. 5 discloses a schematic diagram of a triple tuned filter utilizing conventional helical resonators consisting of coiled wires. The inductance and capacitance of each resonator is not lumped but distributed along the coiled wire. The coupling capacitance is due to the physical positioning of the resonators adjacent to each other. Thus no separate capacitor elements are required in this filter. The response curve for this type filter is substantially the same as that illustrated in FIG. 4. The filter is very compact, having an overall size of about two inches by one inch, uses fewer components and is readily manufacturable. Hence, it represents the preferred implementation of the invention.

A single turn input coil L5 is coupled to the first helical resonator R6 which, as mentioned, is formed by its distributed capacitance and inductance, indicated by an equivalent capacitor C8 and an equivalent inductance L6. A second helical resonator R7 consisting of an equivalent inductance L7 and an equivalent capacitance C9 is coupled to the first resonator R6 by a capacitance C11 resulting from the physical placement of the resonators adjacent to each other. Similarly, a third resonator R8 consisting of an equivalent inductance L8 and an equivalent capacitance C10 is coupled to R7 by a capacitance C12 resulting from physical placement of the components. A single turn output coil L9 is coupled to the third resonator R8.

In FIG. 6 a simplified physical layout of the triple tuned filter of FIG. 5 is illustrated. A rectangular metal housing 30 having dimensions as indicated above includes a pair of vertical metal shields 31 and 32 extending partially across the narrrow dimension of housing 30 and dividing the enclosure into three compartments, each housing one of the helical resonators R6, R7 and R8. Two coupling wires 40 and 41 are connected to input coil L5 and output coil L9, respectively, and positioned adjacent to resonator R7. Resonators R6, R7 and R8 are each connected to ground at one end and unconnected at their other ends. Wires 40 and 41 are both positioned in an energy-coupling relationship with resonator R7 for providing output to input coupling substantially as described for the filter of FIGS. 2 and 3.

FIGS. 7, 8 and 9 are enlarged views of the preferred form of helical resonator filter (illustrated without metal shielding covers for clarity). It consists of rectangular metal housing 30 having vertically disposed metal shields 31 and 32 extending partly across the width of the housing. A planar phenolic insulating support 39 is mounted in the housing for supporting helical resonators R6, R7 and R8 and wire 40 and 41. A pair of conventional co-axial lines are provided at the ends of the housing with line 33 comprising an input connection and line 34 comprising an output connection. Input coil L5 is connected to line 33 and output coil L9 is connected to line 34. One end of the housing includes a plurality of holes and a corresponding plurality of nuts 35 soldered to the housing in individual alignment with the holes, respectively. The nuts are adapted to threadingly receive a corresponding plurality of adjustment screws T5-T9. Screws T5, T6 and T7 are in alignment with the axes of resonators R6, R7 and R8, respectively and affect tuning by being turned "in and out". Screws T8 and T9 are in alignment with shields 31 and 32 and their positions affect the capacitive coupling between resonators R6 and R7 and resonators R7 and R8, respectively.

The FIG. 8 sectional view of FIG. 7 (taken along the line 8—8) clearly shows the position of phenolic support 39 in the housing and the locations of helical resonators R6, R7 and R8 and shields 31 and 32. As best seen in FIG. 9, coupling wires 40 and 41 are shown connected to lines 33 and 34, respectively and are positioned adjacent to resonator R7, but on the opposite side of substrate 39.

As alluded to above front and rear close fitting metal covers (not shown) are preferably affixed to housing 30 and soldered along their periphery to form a completely enclosed and shielded filter. As mentioned, the response characteristic of th filter of this embodiment may be made substantially identical to that illustrated in FIG. 4, by appropriate positioning of coupling wires 40 and 41 and adjustment of the tuning screws.

It will be appreciated that coupling wires 40 and 41 may consist in the main, of foil leads on the substrate with only their ends free for adjustment purposes. Such details are an obvious matter of design choice.

What has been described is a novel 400 MHz IF filter for use in connection with a direct broadcast satellite television receiver. It will be recognized that numerous changes and modifications in the described embodiment of the invention will be apparent to those skilled in the art without departing from the true spirit and scope thereof. The invention is to be limited only as defined in the claims.

What is claimed is:

1. A high frequency filter comprising:
- three resonators, each including an inductive portion;
- capacitance means coupling said three resonators to form a filter having an input resonator, an output resonator and an intermediate resonator;
- an input connection to said input resonator;
- an output connection to said output resonator; and
- coupling means coupling both said input resonator and said output resonator to said intermediate resonator for sharpening the frequency pass band of said filter.

2. The filter of claim 1 wherein the said resonators are helical resonators and wherein said capacitance means are provided by positioning said helical resonators in proximity to each other.

3. The filter of claim 2 wherein said coupling means comprise two conductors connected to said input and output connections, respectively and positioned adjacent to said intermediate resonators.

4. The filter of claim 3 further including adjustment means for varying the capacitance of said helical resonators and for adjusting the coupling between said helical resonators. comprise two conductors connected to said input and output connections, respectively and positioned adjacent to said intermediate resonators.

5. The filter of claim 4 further including a substrate upon which said helical resonators are mounted and a foil arrangement on the obverse side of said substrate comprising at least a portion of said two conductors.

6. The filter of claim 5 further including a metal housing enclosing said filter and wherein said adjustment means comprise a plurality of screws supported on said housing and accessible from the outside thereof for adjusting the capacitive coupling between said helical resonators.

7. A high frequency filter comprising:
- a plurality of resonators, each including an inductive portion;
- a substrate having conductive foil on one side thereof, said plurality of inductive portions being defined in said foil;
- capacitance means coupling said plurality of resonators to form a filter having an input resonator and an output resonator, with said input resonator being in a first compartment and said output resonator being in a second compartment and with said input resonator and said output resonator being positioned adjacent to each other;
- a pair of intermediate stages in a third compartment with said three compartments being arranged in a generally U-shaped configuration;
- an input connection to said input resonator;
- an output connection to said output resonator;
- a plurality of leadless capacitors mounted in suitable apertures in said substrate and electrically connected between respective ones of said inductors and said foil; and
- means mutually coupling said input resonator to said output resonator for sharpening the frequency pass band of said filter.

8. The filter of claim 7 further including a plurality of adjustable wire loops aligned in parallel with said inductive portions for tuning said filter.

9. A high frequency filter for use with a satellite television receiver comprising:
- first, second and third helical resonators;
- capacitance means intercoupling said first helical resonator with said second helical resonator and said second helical resonator with said third helical resonator for forming a triple tuned filter;
- input and output connections coupled to said first helical resonator and said third helical resonator, respectively; and
- conductor means connected to said input connection and to said output connection, respectively, and positioned adjacent to said second helical resonator for sharpening the skirts of the frequency response characteristic of said filter.

10. The filter of claim 9 further including means for adjusting the tuning of said helical resonators and means for adjusting said capacitance means intercoupling said helical resonators.

11. The filter of claim 10 further including a substrate and wherein said first, second and third helical resonators are supported on said substrate, and wherein said conductor means are partially formed by a foil pattern on the obverse side of said substrate and wherein said means for adjusting the tuning of said helical resonators comprises a plurality of screws positioned with respect to said helical resonators.

* * * * *

UNITED STATES PATENT AND TRADEMARK OFFICE

CERTIFICATE OF CORRECTION

PATENT NO. : 4,621,245

DATED : November 4, 1986

INVENTOR(S) : Dobrovolny et al

It is certified that error appears in the above-identified patent and that said Letters Patent is hereby corrected as shown below:

In claim 4, column 5, lines 4-6, delete "comprise two conductors connected to said input and output connections, respectively and positioned adjacent to said intermediate resonators."

Signed and Sealed this

Twenty-third Day of February, 1988

*Attest:*

DONALD J. QUIGG

*Attesting Officer* *Commissioner of Patents and Trademarks*